United States Patent
Kamath et al.

(10) Patent No.: US 10,134,615 B2
(45) Date of Patent: Nov. 20, 2018

(54) SUBSTRATE SUPPORT WITH IMPROVED RF RETURN

(71) Applicant: APPLIED MATERIALS, INC., Santa Clara, CA (US)

(72) Inventors: Aravind Miyar Kamath, Santa Clara, CA (US); Cheng-Hsiung Tsai, Cupertino, CA (US); Jallepally Ravi, San Ramon, CA (US); Tomoharu Matsushita, Chiba (JP); Yu Chang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 339 days.

(21) Appl. No.: 15/019,573

(22) Filed: Feb. 9, 2016

(65) Prior Publication Data
US 2016/0240426 A1    Aug. 18, 2016

Related U.S. Application Data

(60) Provisional application No. 62/116,218, filed on Feb. 13, 2015.

(51) Int. Cl.
*H01L 21/687* (2006.01)
*H01L 21/67* (2006.01)
*H01J 37/32* (2006.01)

(52) U.S. Cl.
CPC .. *H01L 21/67248* (2013.01); *H01J 37/32082* (2013.01); *H01J 37/32532* (2013.01); *H01J 37/32724* (2013.01); *H01L 21/67103* (2013.01); *H01L 21/68792* (2013.01)

(58) Field of Classification Search
CPC .................... H01L 21/68785; H01L 21/67248
See application file for complete search history.

(56) References Cited

U.S. PATENT DOCUMENTS

| 2002/0022403 A1* | 2/2002 | Cheng ................. H01L 21/6833 439/625 |
| 2010/0000684 A1 | 1/2010 | Choi |
| 2011/0100552 A1 | 5/2011 | Dhindsa et al. |
| 2012/0222815 A1 | 9/2012 | Sabri et al. |
| 2013/0001215 A1 | 1/2013 | Chang et al. |
| 2013/0092086 A1 | 4/2013 | Keil et al. |
| 2013/0319854 A1 | 12/2013 | Parkhe et al. |

OTHER PUBLICATIONS

International Search Report and Written Opinion dated May 20, 2016 for PCT Application No. PCT/US2016/017452.

* cited by examiner

*Primary Examiner* — Joseph A Miller, Jr.
(74) *Attorney, Agent, or Firm* — Moser Taboada; Alan Taboada

(57) ABSTRACT

Apparatus for processing a substrate are provided herein. In some embodiments, a substrate support includes a body having a support surface; an RF electrode disposed in the body proximate the support surface to receive RF current from an RF source; a shaft to support the body; a conductive element having an interior volume and extending through the shaft, wherein the conductive element is coupled to the RF electrode; and an RF gasket; wherein the conductive element includes features that engage the RF gasket to return the RF current to ground.

18 Claims, 3 Drawing Sheets

SUBSTRATE SUPPORT WITH IMPROVED RF RETURN

CROSS-REFERENCE TO RELATED APPLICATIONS

This application claims benefit of U.S. provisional patent application Ser. No. 62/116,218, filed Feb. 13, 2015, which is herein incorporated by reference in its entirety.

FIELD

Embodiments of the present disclosure generally relate to substrate processing systems, and more specifically to substrate supports for use in substrate processing systems.

BACKGROUND

Substrate processing apparatus typically include a substrate support to support a substrate during processing. The substrate support may include a radio frequency (RF) electrode disposed proximate a substrate processing surface to receive RF current from an RF source. For example, the RF electrode may act as an RF return to ground or have the RF source coupled to the RF electrode. The RF electrode may be coupled to a rod, a wire, or the like to provide RF current to the RF electrode or to return the RF current to ground. The substrate support may further include a heater disposed proximate the substrate processing surface to heat a substrate when disposed on the substrate processing surface. However, the inventors have observed that thermocouples and AC power leads that are in the path of the RF return path are adversely affected by RF noise.

Thus, the inventors have provided an improved substrate processing apparatus.

SUMMARY

Apparatus for processing a substrate are provided herein. In some embodiments, a substrate support includes a body having a support surface; an RF electrode disposed in the body proximate the support surface to receive RF current from an RF source; a shaft to support the body; a conductive element having an interior volume and extending through the shaft, wherein the conductive element is coupled to the RF electrode; and an RF gasket; wherein the conductive element includes features that engage the RF gasket to return the RF current to ground.

In some embodiments, a substrate processing system includes a process chamber enclosing a processing volume; and a substrate support disposed in the processing volume. The substrate support includes a body having a support surface; an RF electrode disposed in the body proximate the support surface to receive RF current from an RF source; a shaft to support the body; a conductive element having an interior volume and extending through the shaft, wherein the conductive element is coupled to the RF electrode; and an RF gasket, wherein the conductive element includes features that engage the RF gasket to return the RF current to ground.

In some embodiments, a substrate support includes a body having a support surface; an RF electrode disposed in the body proximate the support surface to receive RF current from an RF source; a shaft to support the body; a conductive element having an interior volume and extending through the shaft, wherein the conductive element is coupled to the RF electrode; and an RF gasket, wherein the conductive element includes features that engage the RF gasket to return the RF current to ground; a heat transfer body to transfer heat to or from the substrate support; an adapter portion coupled between the shaft and the heat transfer body, wherein the RF gasket is disposed between the adapter portion and the heat transfer body; a heater disposed in the substrate support proximate the support surface to provide heat to a substrate when disposed on the support surface, the heater having one or more conductive lines disposed in the interior volume of the conductive element to provide power to the heater; a thermocouple disposed in the interior volume of the conductive element to measure a temperature of a substrate when disposed on the support surface; and an annular biasable element surrounding the adapter portion, wherein the annular biasable element contacts the adapter portion when the substrate support is in a processing position, wherein the annular biasable element is spaced apart from the adapter portion when the substrate support is not in the processing position, and wherein the annular biasable element is coupled to a floor of a process chamber in which the substrate support is disposed.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
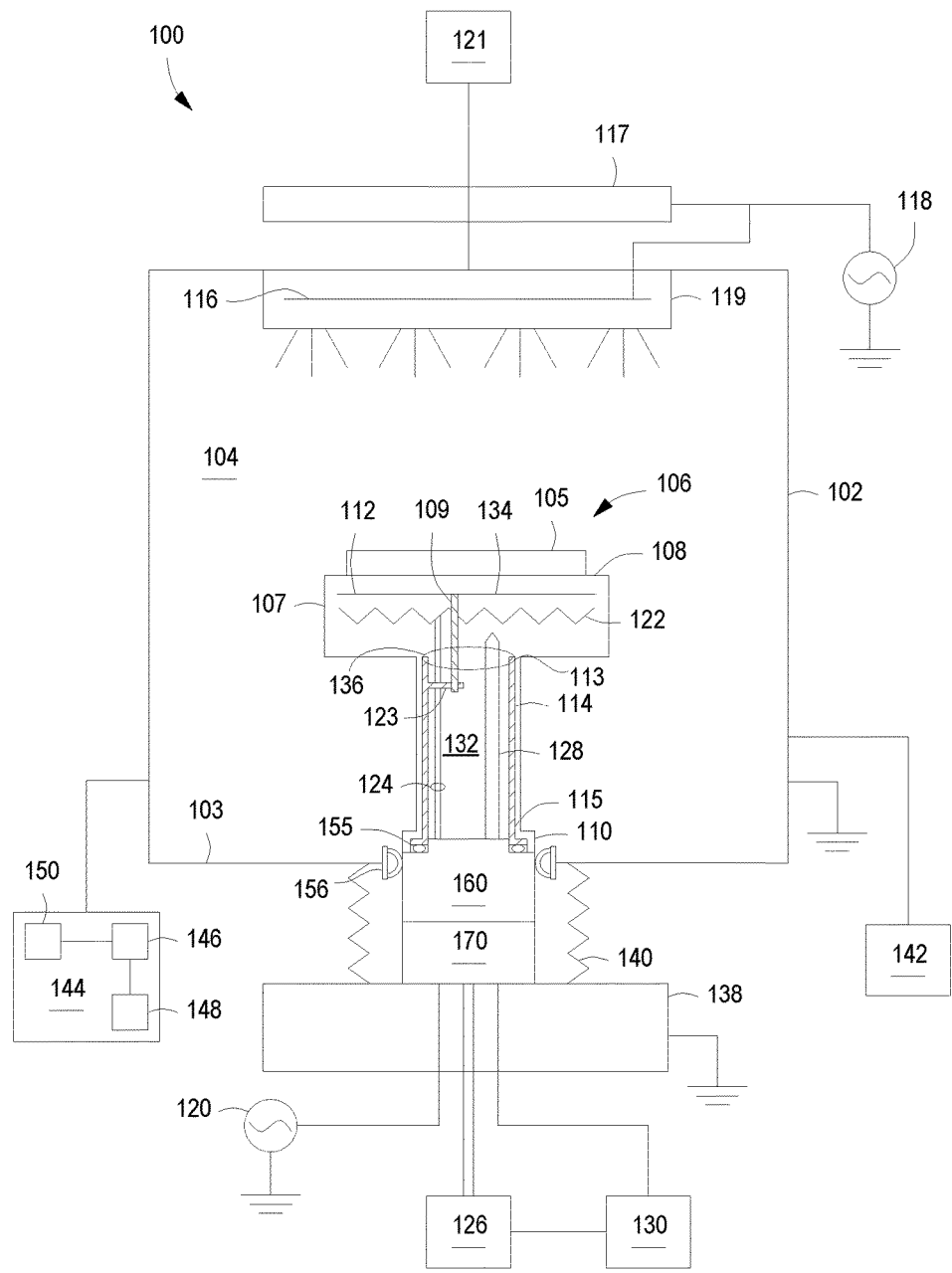
FIG. 1 depicts a schematic view of a substrate processing system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Apparatus for processing a substrate is disclosed herein. Embodiments of the inventive apparatus may advantageously shorten the RF current grounding path and prevent the distortion of temperature measurements made by a thermocouple or other temperature monitoring device present in the substrate support.

Figure 2:
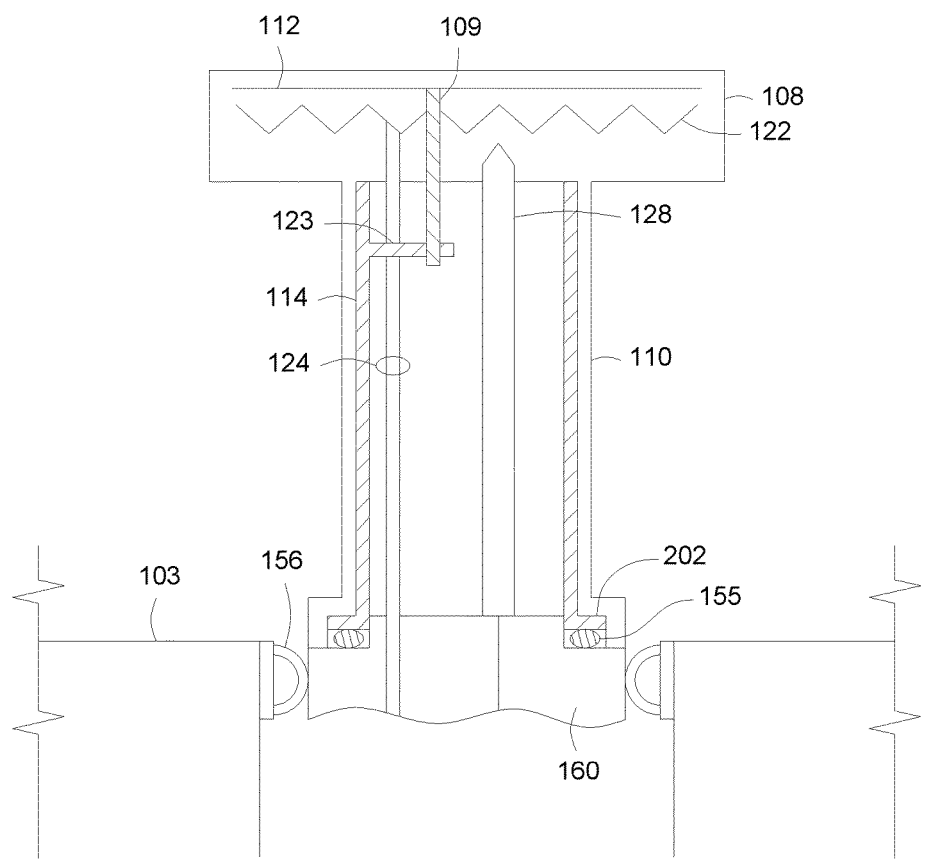
FIG. 2 depicts a partial schematic view of a substrate support in accordance with some embodiments of the present disclosure.

The following description will be made with reference to FIGS. 1 and 2. FIG. 1 depicts a schematic view of a substrate processing system in accordance with some embodiments of the present disclosure. FIG. 2 depicts a partial schematic view of the substrate processing system of FIG. 1. For example, a substrate processing system 100 may include a process chamber 102 having a processing volume 104 and a substrate support 106 disposed in the processing volume 104 for supporting a substrate 105. The process chamber 102 may comprise walls formed of conductive materials, such as aluminum (Al) or the like. In some embodiments, for example, when the process chamber 102 is configured for capacitively or inductively coupled plasma applications, the process chamber may have a ceiling comprising a dielectric material (not shown). Exemplary process chambers may include any suitable plasma process chamber, such those used for generating one or more of a remote, inductively coupled, or capacitively coupled plasma. Suitable process chambers may include the DPS®, ENABLER®, ADVANT-EDGE™, or other process chambers, available from Applied Materials, Inc. of Santa Clara, Calif. Other suitable process chambers may similarly be used.

The substrate support 106 may include a body 107 having a support surface 108 and a shaft 110 to support the body 107. Although illustrated in FIG. 1 as a pedestal-type design, the substrate support may be any suitable substrate support having a support surface and a member, such as the shaft 110 or any other suitable member for supporting the support surface. In some embodiments, the substrate support 106 may comprise a ceramic material, such as, for example, aluminum oxide ($Al_2O_3$) or aluminum nitride (AlN). In some embodiments, the substrate support 106 may be coupled to a heat transfer body 170 via an adapter portion 160. The heat transfer body 170 may cool or transfer heat to the substrate support 106 depending on the process being performed. In some embodiments, the heat transfer body 170 includes channels (not shown) through which a coolant is flowed to cool the substrate support 106.

The substrate support 106 may include an RF electrode 112 (e.g., a first RF electrode) disposed in the substrate support 106 proximate the support surface to receive RF current from an RF source. In some embodiments, the RF electrode 112 may provide an RF return path and may be coupled through a conductive element 114 to ground as illustrated in the primary view in FIG. 1. For example, the RF electrode 112 may function as an RF return path, for example, when the process chamber 102 is configured as a capacitively coupled plasma apparatus. In a capacitively coupled plasma apparatus, a second RF electrode 116 may be disposed above the substrate support 106 as illustrated in the primary view in FIG. 1. The second RF electrode 116 may be disposed in the processing volume 104 and an RF source 118 may be coupled to the second electrode 116 as illustrated in the primary view in FIG. 1. For example, the second RF electrode 116 may be a showerhead (not shown), or part of and/or disposed in a showerhead 119 as illustrated in FIG. 1, or any suitable embodiment of an overhead electrode used in a capacitively coupled plasma apparatus.

In some embodiments, the process chamber 102 may be configured as an inductively coupled plasma apparatus. In such embodiments, the second RF electrode (i.e., a second RF electrode 117 as illustrated in phantom in FIG. 1) may be disposed external to the processing volume 104 of the process chamber 102 and coupled to the RF source 118.

The showerhead 119 may be coupled to a gas panel 121 as illustrated in FIG. 1 to provide one or more process gases to the processing volume 104 to ignite a plasma in the processing volume 104 or the like. The showerhead 119 is merely one exemplary chamber component for delivering one or more process gases to the processing volume 104. Alternatively or in combination, the one or more process gases may be delivered to the processing volume 104 via side injection ports (not shown) disposed about the walls of the process chamber 102, or gas inlets disposed in other regions of the process chamber. Alternatively or in combination, the one or more process gases may be delivered to a remote volume (not shown) where a plasma is formed and then flowed into the processing volume 104.

In some embodiments, the RF electrode 112 may also be coupled to an output of an RF source (such as the RF source 120 shown in phantom in FIG. 1) via a conductive element 114 and having an RF return path via the conductive element 114, which will be described in greater detail with respect to FIGS. 2 and 3. For example, the RF electrode 112 may be used as an RF bias electrode or the like. The RF electrode 112 may be coupled to the conductive element 114 via, for example, an RF pin 109. However, any conductive fixation element may be used to couple the RF electrode 112 to the conductive element 114.

Returning to the substrate support 106, in some embodiments, the substrate support 106 may include a heater 122 disposed in the substrate support 106 proximate the support surface 108 to provide heat to the substrate 105 when disposed on the support surface 108. The heater 122 may be any suitable heater used in a substrate support, such as a resistive heater or the like. The heater 122 may include one or more conductive lines 124 that extend from the heater 122 through the shaft 110 to provide power to the heater 122. For example, as illustrated in FIG. 1, the one or more conductive lines 124 may couple the heater 122 to a power supply 126 disposed external of the process chamber 102. For example, the one or more conductive lines 124 may include a first line for providing power from the power supply 126 to the heater 122 and a second line for returning power to the power supply 126. The power supply 126 may include an alternating current (AC) power source, a direct current (DC) power source or the like. Alternatively (not shown), the one or more conductive lines 124 may be a single conductive line, which provides power from the power supply 126 to the heater 122. The power may be returned to the power supply 126 or to ground via the conductive element 114. For example, the conductive element 114 may act as an electrical return for both the heater 122 and the RF electrode 112.

The substrate support 106 may include a thermocouple 128 disposed in the substrate support 106 to measure a desired temperature, such as the temperature of the substrate support 106, the support surface 108, or the temperature of the substrate 105 when disposed on the support surface 108. For example, the thermocouple 128 may be any suitable thermocouple design, such as a thermocouple probe or the like. The thermocouple 128 may be removable. As illustrated in FIG. 1, the thermocouple 128 may extend along the shaft 110 of the substrate support 106 to proximate the support surface 108. The thermocouple 128 as illustrated in FIG. 1 is merely exemplary, and the tip of the thermocouple may extend to proximate the heater 122 (as illustrated in FIG. 1) or to above the heater 122 and proximate the support surface 108 (not shown). The location of the tip of the thermocouple 128 may be adjusted relative to the support surface 108 to provide the most accurate measurement of temperature of the substrate 105 or of some other component such as the support surface 108. The thermocouple 128 may be coupled to a temperature controller 130. For example, the temperature controller 130 may control the power supply 126 based on the temperature measured by the thermocouple 128. Alternatively, the temperature controller 130 may be part of, or coupled to, a system controller, such as the controller 144 that may control the operations of the substrate processing system 100.

In some embodiments, the conductive element 114 may be disposed along the shaft 110 of the substrate support 106. For example, the conductive element may include an interior volume 132 with the one or more conductive lines 124 and the thermocouple 128 disposed through the interior volume 132 of the conductive element 114. The conductive element 114 may be coupled to the RF electrode 112 as discussed above. For example, the conductive element 114 may have a protrusion 123 at a first end 113 that extends into the interior volume 132. The RF pin 109 may be inserted into or coupled to the protrusion 123 to couple the RF pin 109 and the RF electrode 112 to the conductive element 114. The conductive element 114 may have a second end 115 coupled to ground via an RF gasket 155 disposed on the adapter portion 160, as illustrated in FIGS. 1 and 2. The RF gasket may comprise copper beryllium or the like. The conductive element 114 includes a plurality of features 202 (also described below with respect to FIG. 3) that can be bent into any predetermined position to interface with the RF gasket 155.

In some embodiments, the conductive element 114 may advantageously provide an electric field of about zero in the interior volume 132 when RF current flows through the conductive element 114. Providing an electric field in the interior volume 132 of about zero advantageously prevents or limits any interference arising from RF current flowing through the conductive element 114 that may affect other electric components disposed in the shaft, such as the thermocouple 128. The inventors have found, for example, that the rod-like conductive element used as an RF return path in conventional substrate supports provide a non-zero electric field in the shaft that interferes with the thermocouple 128 and causes the thermocouple to produce inaccurate temperature measurements. The conductive element 114 may comprise any suitable process compatible conductive materials, such as aluminum (Al), nickel (Ni), tungsten (W), or the like.

In some embodiments, the conductive element 114 may be disposed in the shaft 110 of the substrate support 106. For example, as illustrated in FIG. 1, the conductive element may be cylindrical (as represented by dashed line 136), such as a cylinder or another suitable tubular structure having the interior volume 132 that produces an electric field of about zero in the interior volume when current flows along the surface of the cylindrical conductive element. The design of the present disclosure advantageously shortens the RF return path.

In some embodiments, the substrate support 106 may include an annular biasable element 156 that contacts the adapter portion 160 when the substrate support 106 is in a processing position, as shown in FIGS. 1 and 2. The annular biasable element 156 is coupled to a floor 103 of the process chamber 102. In some embodiments, the annular biasable element 156 comprises copper beryllium, for example, for low temperature applications (e.g., up to 150° C.). In some embodiments, the annular biasable element 156 comprises nickel beryllium, for example, for high temperature applications (e.g., up to 300° C.). The annular biasable element 156 electrically couples the adapter portion 160 directly to the process chamber 102, thus shortening the RF return path.

Returning to FIG. 1, the substrate 105 may enter the process chamber 102 via an opening (not shown) in a wall of the process chamber 102. The opening may be selectively sealed via a slit valve, or other mechanism for selectively providing access to the interior of the chamber through the opening. The substrate support 106 may be coupled to a lift mechanism 138 that may control the position of the substrate support 106 between a lower position suitable for transferring substrates into and out of the chamber via the opening and a selectable upper position suitable for processing. The process position may be selected to maximize process uniformity for a particular process. When in at least one of the elevated processing positions, the substrate support 106 may be disposed above the opening to provide a symmetrical processing region. The lift mechanism 138 may be coupled to the process chamber 102 via a bellows 140 or other flexible vacuum hose to maintain a predetermined pressure or pressure range in the processing volume 104 when the substrate support 106 is moved. The lift mechanism 138 may be grounded as illustrated in FIG. 1. For example, the conductive element 114 may be grounded via the lift mechanism 138. Alternatively, the lift mechanism 138 may be ground via the process chamber 102 through the bellows 140.

The apparatus may include additional components that are common to process chambers, such as an exhaust system 142 for removing excess process gases, processing by-products, or the like, from the processing volume 104 of the process chamber 102. For example, the exhaust system 142 may include a vacuum pump coupled to a pumping plenum via a pumping port for pumping out the exhaust gases from the process chamber 102 (not shown), or any suitable exhaust system. For example, the vacuum pump may be fluidly coupled to an exhaust outlet for routing the exhaust to appropriate exhaust handling equipment. A valve (such as a gate valve, z-motion valve, or the like) may be disposed in the pumping plenum to facilitate control of the flow rate of the exhaust gases in combination with the operation of the vacuum pump.

To facilitate control of the process chamber 102 as described above, a controller 144 comprises a central processing unit (CPU) 146, a memory 148, and support circuits 150 for the CPU 146 and facilitates control of the components of the process chamber 102. The controller 144 may be any form of general-purpose computer processor that can be used in an industrial setting for controlling various chambers and sub-processors. The memory 148, or computer-readable medium, of the CPU 146 may be one or more of readily available memory such as random access memory (RAM), read only memory (ROM), floppy disk, hard disk, or any other form of digital storage, local or remote. The support circuits 150 are coupled to the CPU 146 for supporting the processor in a conventional manner. These circuits include cache, power supplies, clock circuits, input/output circuitry and subsystems, and the like. The methods performed in the process chamber 102, or at least portions thereof, may be stored in the memory 148 as a software routine. The software routine may also be stored and/or executed by a second CPU (not shown) that is remotely located from the hardware being controlled by the CPU 146.

Figure 3:
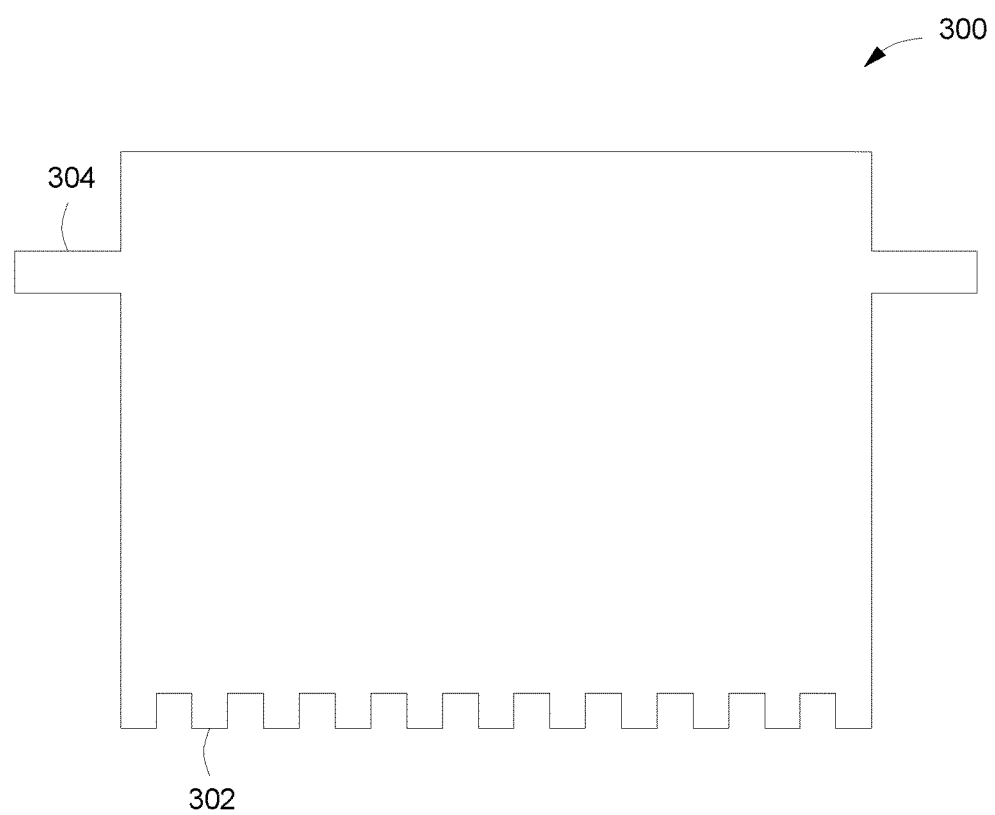
FIG. 3 depicts schematic view of a sheet metal cutout in accordance with some embodiments of the present disclosure.

FIG. 3 illustrates a sheet metal cutout 300 in accordance with some embodiments of the present disclosure. The sheet metal cutout 300 is bent into a predetermined shape to form a conductive element (e.g., conductive element 114). The sheet metal cutout 300 may comprise any process compatible conductive materials, such as those discussed above with respect to the conductive element 114. In some embodiments, the sheet metal cutout 300 includes a plurality of features 302 (e.g., features 202) and one or more protrusions 304 (e.g., 123). The features 302 can be bent into any predetermined position. When the sheet metal cutout 300 is bent into a predetermined shape, the one or more protrusions are aligned and extend into an interior of the final product (i.e., the conductive element). Utilization of sheet metal to form the conductive element advantageously results in increased surface area for the RF return current, thus improving grounding.

Thus, apparatus for processing a substrate are disclosed herein. Embodiments of the inventive apparatus may advantageously permit RF power to be received by an RF electrode disposed in a substrate support without interfering with other electrical components routed through the substrate support, such as interfering with the accuracy of temperature measurements made by a thermocouple or other temperature monitoring device present in the substrate support.

While the foregoing is directed to embodiments of the present disclosure, other and further embodiments of the disclosure may be devised without departing from the basic scope thereof.

The invention claimed is:

1. A substrate support, comprising:
    a body having a support surface;
    an RF electrode disposed in the body proximate the support surface to receive RF current from an RF source;
    a shaft to support the body;
    a conductive element having an interior volume and extending through the shaft, wherein the conductive element is coupled to the RF electrode, and wherein the conductive element includes a protrusion extending into the interior volume;
    an RF pin coupled to the RF electrode at a first end and to the protrusion at a second end opposite the first end; and
    an RF gasket, wherein the conductive element includes features that engage the RF gasket to return the RF current to ground.

2. The substrate support of claim 1, further comprising:
    a heat transfer body to transfer heat to or from the substrate support;
    an adapter portion coupled between the shaft and the heat transfer body, wherein the RF gasket is disposed between the adapter portion and the conductive element;
    a heater disposed in the substrate support proximate the support surface to provide heat to a substrate when disposed on the support surface, the heater having one or more conductive lines to provide power to the heater; and
    a thermocouple disposed in the substrate support to measure a temperature of a substrate when disposed on the support surface.

3. The substrate support of claim 2, wherein one or more conductive lines and the thermocouple are disposed in the interior volume of the conductive element.

4. The substrate support of claim 2, further comprising:
    an annular biasable element surrounding the adapter portion, wherein the annular biasable element contacts the adapter portion when the substrate support is in a processing position, wherein the annular biasable element is spaced apart from the adapter portion when the substrate support is not in the processing position, and wherein the annular biasable element is coupled to a floor of a process chamber in which the substrate support is disposed.

5. The substrate support of claim 4, wherein the annular biasable element comprises copper beryllium or nickel beryllium.

6. The substrate support of claim 1, wherein the conductive element has an electric field of about zero in the interior volume when RF current is flowed through the conductive element.

7. The substrate support of claim 1, wherein the conductive element is cylindrical.

8. The substrate support of claim 7, wherein the conductive element is formed from sheet metal.

9. A substrate processing system, comprising:
    a process chamber enclosing a processing volume;
    a substrate support disposed in the processing volume, the substrate support comprising:
        a body having a support surface;
        an RF electrode disposed in the body proximate the support surface to receive RF current from an RF source;
        a shaft to support the body;
        a conductive element having an interior volume and extending through the shaft, wherein the conductive element is coupled to the RF electrode; and
        an RF gasket, wherein the conductive element includes features that engage the RF gasket to return the RF current to ground; and
    an annular biasable element coupled to a floor of the process chamber, wherein the annular biasable element electrically couples the substrate support to the process chamber when the substrate support is in a processing position, and wherein the annular biasable element is spaced apart from the substrate support when the substrate support is not in the processing position.

10. The substrate processing system of claim 9, wherein the substrate support further comprises:
    a heat transfer body to transfer heat to or from the substrate support;
    an adapter portion coupled between the shaft and the heat transfer body, wherein the RF gasket is disposed between the adapter portion and the conductive element;
    a heater disposed in the substrate support proximate the support surface to provide heat to a substrate when disposed on the support surface, the heater having one or more conductive lines to provide power to the heater; and
    a thermocouple disposed in the substrate support to measure a temperature of a substrate when disposed on the support surface.

11. The substrate processing system of claim 10, wherein one or more conductive lines and the thermocouple are disposed in the interior volume of the conductive element.

12. The substrate processing system of claim 10, wherein the annular biasable element surrounds the adapter portion, and wherein the annular biasable element contacts the adapter portion when the substrate support is in a processing position and is spaced apart from the adapter portion when the substrate support is not in the processing position.

13. The substrate processing system of claim 9, wherein the annular biasable element comprises copper beryllium or nickel beryllium.

14. The substrate processing system of claim 9, wherein the conductive element has an electric field of about zero in the interior volume when RF current is flowed through the conductive element.

15. The substrate processing system of claim 9, wherein the conductive element includes a protrusion extending into the interior volume.

16. The substrate processing system of claim 15, wherein the substrate support further comprises:
    an RF pin coupled to the RF electrode at a first end and to the protrusion at a second end opposite the first end.

17. The substrate processing system of claim 9, wherein the conductive element is cylindrical and formed from sheet metal.

18. A substrate support, comprising:
a body having a support surface;
an RF electrode disposed in the body proximate the support surface to receive RF current from an RF source;
a shaft to support the body;
a conductive element having an interior volume and extending through the shaft, wherein the conductive element is coupled to the RF electrode; and
an RF gasket, wherein the conductive element includes features that engage the RF gasket to return the RF current to ground;
a heat transfer body to transfer heat to or from the substrate support;
an adapter portion coupled between the shaft and the heat transfer body, wherein the RF gasket is disposed between the adapter portion and the conductive element;
a heater disposed in the substrate support proximate the support surface to provide heat to a substrate when disposed on the support surface, the heater having one or more conductive lines disposed in the interior volume of the conductive element to provide power to the heater;
a thermocouple disposed in the interior volume of the conductive element to measure a temperature of a substrate when disposed on the support surface; and
an annular biasable element surrounding the adapter portion, wherein the annular biasable element contacts the adapter portion when the substrate support is in a processing position, wherein the annular biasable element is spaced apart from the adapter portion when the substrate support is not in the processing position, and wherein the annular biasable element is coupled to a floor of a process chamber in which the substrate support is disposed.

* * * * *